US009576746B2

(12) United States Patent
Ueno et al.

(10) Patent No.: US 9,576,746 B2
(45) Date of Patent: Feb. 21, 2017

(54) ENERGY STORAGE MODULE INCLUDING CONDUCTIVE MEMBER SECURED ON BUS BAR AND IN CONTACT WITH PAD OF WIRING BOARD

(75) Inventors: Naoki Ueno, Hokuto (JP); Kazuhiro Ohhashi, Kofu Yamanashi (JP); Tomohiro Ohshima, Hokuto (JP); Kenji Nansaka, Kofu Yamanashi (JP)

(73) Assignee: JM Energy Corporation, Hokuto-shi (JP)

( * ) Notice: Subject to any disclaimer, the term of this patent is extended or adjusted under 35 U.S.C. 154(b) by 270 days.

(21) Appl. No.: 14/113,526

(22) PCT Filed: Apr. 12, 2012

(86) PCT No.: PCT/JP2012/060045
§ 371 (c)(1),
(2), (4) Date: Dec. 24, 2013

(87) PCT Pub. No.: WO2012/147531
PCT Pub. Date: Nov. 1, 2012

(65) Prior Publication Data
US 2014/0120392 A1    May 1, 2014

(30) Foreign Application Priority Data

Apr. 25, 2011    (JP) .................................. 2011-097079

(51) Int. Cl.
*H01M 2/02*    (2006.01)
*H01M 2/10*    (2006.01)
(Continued)

(52) U.S. Cl.
CPC ........... *H01G 11/08* (2013.01); *G01R 31/3606* (2013.01); *H01G 2/04* (2013.01);
(Continued)

(58) Field of Classification Search
CPC .. H01M 2/0217; H01M 2/206; H01M 2/1077; H01M 2/306; H01M 10/425; H01G 11/76; H01G 11/78; H01G 11/08; H01G 2/04; H01G 2/06
(Continued)

(56) References Cited

U.S. PATENT DOCUMENTS 5,880,951 A    3/1999  Inaba
2012/0019061 A1*  1/2012  Nishihara ........... H01M 2/1077
307/10.1
(Continued)

FOREIGN PATENT DOCUMENTS

CN    101611463 A    12/2009
EP    2 110 824 A1    10/2009
(Continued)

OTHER PUBLICATIONS

Office Action issued Oct. 1, 2014 in Japanese Patent Application No. 2011-097079 (with English language translation).
U.S. Appl. No. 14/442,271, filed May 12, 2015, Nansaka, et al.
U.S. Appl. No. 14/650,726, filed Jun. 9, 2015, Nansaka, et al.
International Search Report Issued Jul. 24, 2012 in PCT/JP12/060045 Filed Apr. 12, 2012.
Extended European Search Report issued Sep. 3, 2014 in Patent Application No. 12777633.4.
(Continued)

*Primary Examiner* — Sean P Cullen
(74) *Attorney, Agent, or Firm* — Oblon, McClelland, Maier & Neustadt, L.L.P.

(57) ABSTRACT

An energy storage module in which a plurality of energy storage cells including electrode terminals are stacked, includes a bus bar that electrically connects a plurality of electrode terminals, a conductive member that is secured on the bus bar, a detection section that detects a voltage of each of the energy storage cells, and a wiring board, a wire that is electrically connected to the detection section, and a pad that is connected to the wire being formed on the wiring board, the conductive member coming in contact with the pad.

10 Claims, 8 Drawing Sheets

(51) Int. Cl.
*H01M 2/20* (2006.01)
*H01M 2/30* (2006.01)
*H01M 10/42* (2006.01)
*H01G 2/04* (2006.01)
*H01G 2/06* (2006.01)
*H01G 11/08* (2013.01)
*H01G 11/76* (2013.01)
*H01G 11/78* (2013.01)
*G01R 31/36* (2006.01)
*H05K 7/14* (2006.01)

(52) U.S. Cl.
CPC ............... *H01G 2/06* (2013.01); *H01G 11/76* (2013.01); *H01G 11/78* (2013.01); *H01M 2/0217* (2013.01); *H01M 2/1077* (2013.01); *H01M 2/206* (2013.01); *H01M 2/305* (2013.01); *H01M 10/425* (2013.01); *H05K 7/1457* (2013.01); *H01M 2010/4271* (2013.01); *Y02E 60/13* (2013.01)

(58) Field of Classification Search
USPC ............................................ 429/90; 361/502
See application file for complete search history.

(56) References Cited

U.S. PATENT DOCUMENTS

| | | |
|---|---|---|
| 2012/0281339 A1 | 11/2012 | Mizukami et al. |
| 2012/0328934 A1 | 12/2012 | Watanabe et al. |

FOREIGN PATENT DOCUMENTS

| | | | |
|---|---|---|---|
| JP | 10 108361 | 4/1998 | |
| JP | 2008 204988 | 9/2008 | |
| JP | WO 2010113455 A1 * | 10/2010 | .......... H01M 2/1077 |
| JP | 2011 023179 | 2/2011 | |
| WO | WO 2010/147384 A2 | 12/2010 | |
| WO | WO 2010/147384 A3 | 12/2010 | |
| WO | 2011 125505 | 10/2011 | |

OTHER PUBLICATIONS

Combined Office Action and Search Report issued Sep. 22, 2015 in Chinese Patent Application No. 201280020446.X (with English translation).

* cited by examiner

ENERGY STORAGE MODULE INCLUDING CONDUCTIVE MEMBER SECURED ON BUS BAR AND IN CONTACT WITH PAD OF WIRING BOARD

TECHNICAL FIELD

The present invention relates to an energy storage module.

BACKGROUND ART

A stacked (laminated) assembled battery has been known in which a plurality of battery cells are connected in series to achieve a high output (see JP-A-2011-23179).

A plurality of battery cells included in such a stacked assembled battery may differ in output voltage during discharge due to the difference in temperature or the like between the battery cells. Therefore, a detection section that detects the output voltage of each battery cell is provided in an assembled battery. The detection section is electrically connected to the electrode terminals of the battery cells through a wire harness, for example.

SUMMARY OF THE INVENTION

Technical Problem

According to the above configuration, however, the working load may increase since it is necessary to connect the wire harness to the electrode terminals of each battery, for example. In particular, it is considered that the working load will further increase since it is necessary to increase the number of stacked battery cells in order to deal with a demand for an increase in capacity and output.

The wire harness also has a problem in that the wire of the wire harness may break due to external impact, for example. A situation may also occur in which the insulating section that covers the wire of the wire harness is removed, and a short circuit occurs when a conductive member comes in contact with the uncovered wire. As a result, the reliability of the energy storage module may deteriorate.

An object of several aspects of the invention is to provide an energy storage module that allows easy electrical connection between electrode terminals of an energy storage cell and a detection section, and exhibits high reliability.

Solution to Problem

The invention was conceived in order to solve at least some of the above problems, and may be implemented by the following aspects or application examples.

Application Example 1

According to one aspect of the invention, there is provided an energy storage module in which a plurality of energy storage cells including electrode terminals are stacked, the energy storage module including:

a bus bar that electrically connects a plurality of electrode terminals among the electrode terminals;

a conductive member that is secured on the bus bar;

a detection section that detects a voltage of each of the plurality of energy storage cells; and a wiring board, a wire that is electrically connected to the detection section, and a pad that is connected to the wire being formed on the wiring board, the conductive member coming in contact with the pad.

Note that the expression "electrical connection" may be used herein when referring to a situation in which a specific member (member A) is ele+ctrically connected to another specific member (member B), for example. In this case, the member A may be electrically connected directly to the member B, or may be electrically connected to the member B through still another member.

Application Example 2

In the energy storage module according to Application Example 1, the conductive member may be a resilient member.

Application Example 3

In the energy storage module according to Application Example 2, the conductive member may include a first section that is connected to the bus bar, and a second section that is supported by the first section, and comes in contact with the pad, the second section having a tapered shape so that a width of the second section increases as a distance from the first section decreases.

Application Example 4

In the energy storage module according to any one of Application Examples 1 to 3, the bus bar may connect the plurality of electrode terminals in series.

Application Example 5

The energy storage module according to any one of Application Examples 1 to 4 may further include a separator that is provided between adjacent energy storage cells among the plurality of energy storage cells.

Application Example 6

In the energy storage module according to any one of Application Examples 1 to 5, the wiring board may extend in a stacking direction of the plurality of energy storage cells.

Application Example 7

In the energy storage module according to any one of Application Examples 1 to 6, each of the plurality of energy storage cells may be a lithium-ion capacitor.

ADVANTAGEOUS EFFECTS OF THE INVENTION

The energy storage module according to the aspect of the invention is configured so that the conductive member secured on the bus bar comes in contact with the pad formed on the wiring board, and the pad is electrically connected to the detection section through the wire formed on the wiring board. The detection section can thus be electrically connected to the electrode terminals of each energy storage cell. Specifically, the energy storage module according to the aspect of the invention is configured so that the electrode terminals and the detection section can easily be electrically connected without using a wire harness.

A wire harness has a problem in that the wire may break, or an insulating section that covers the wire may be removed, for example. Since the energy storage module according to the aspect of the invention does not utilize a wire harness, the energy storage module can prevent occurrence of such a problem, and exhibits high reliability.

DESCRIPTION OF EMBODIMENTS

Exemplary embodiments of the invention are described below with reference to the drawings.

1. Energy Storage Module

Figure 1:
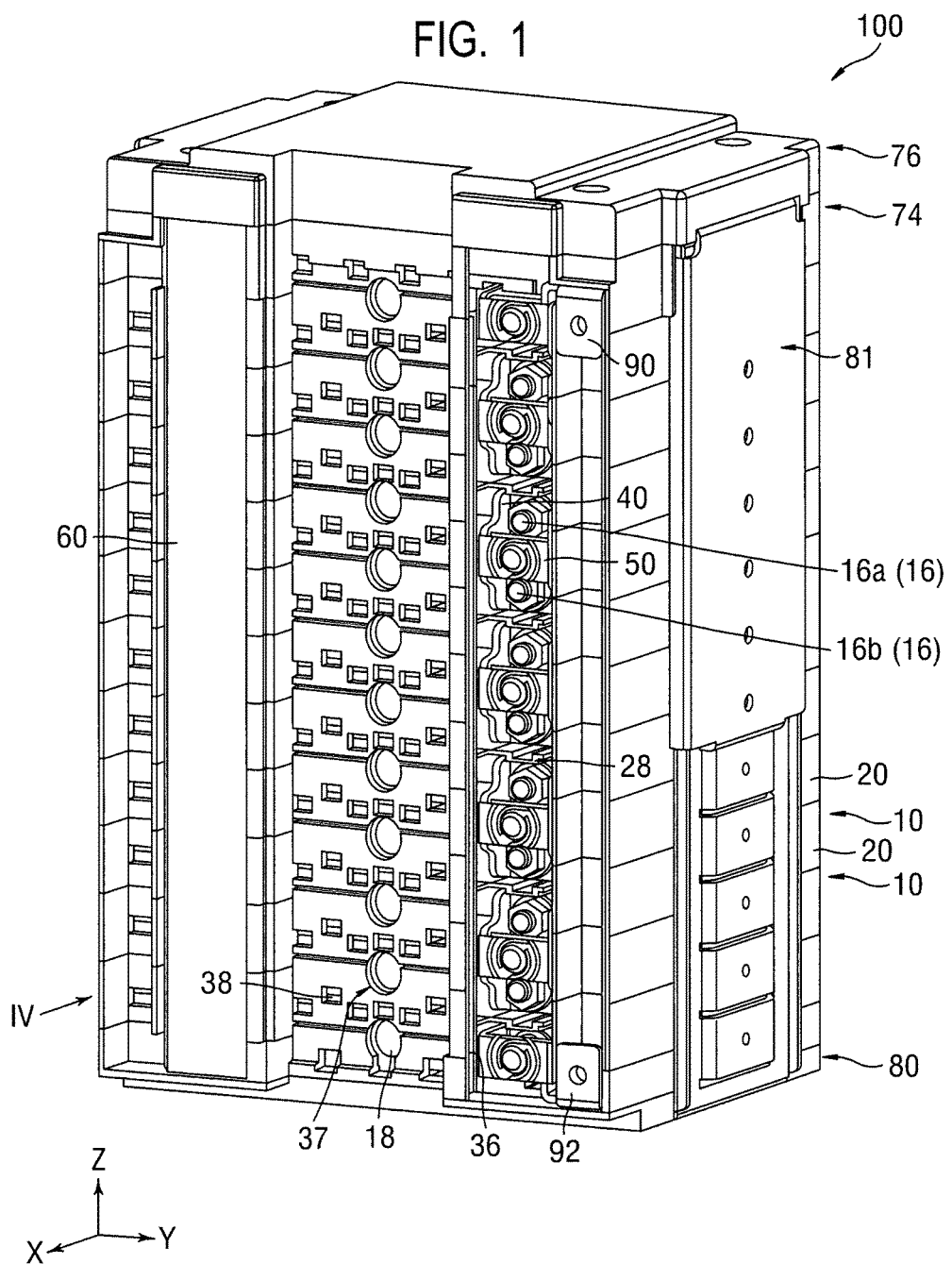
FIG. 1 is a perspective view schematically illustrating an energy storage module according to one embodiment of the invention.
Figure 2:
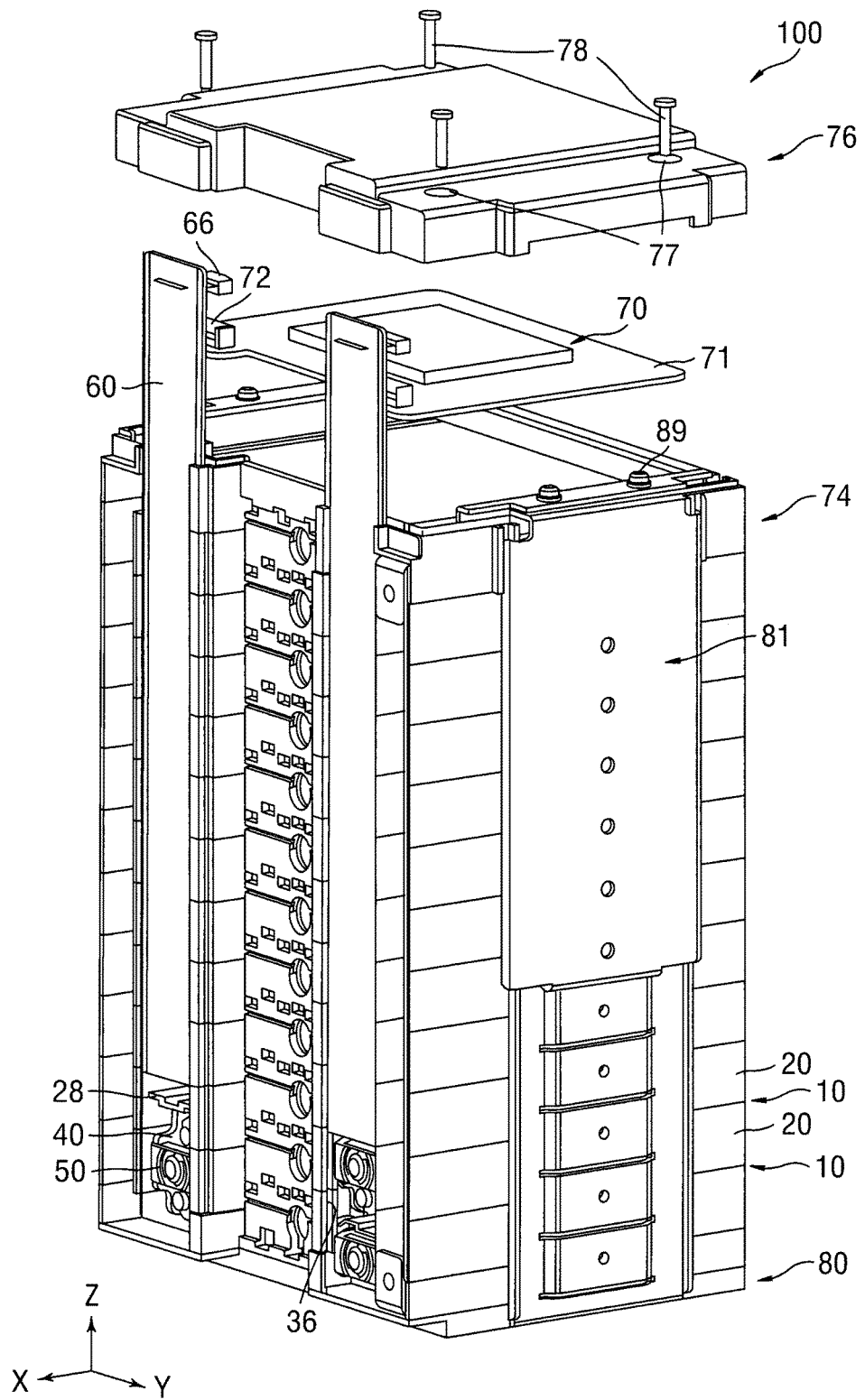
FIG. 2 is an exploded perspective view schematically illustrating an energy storage module according to one embodiment of the invention.
Figure 3:
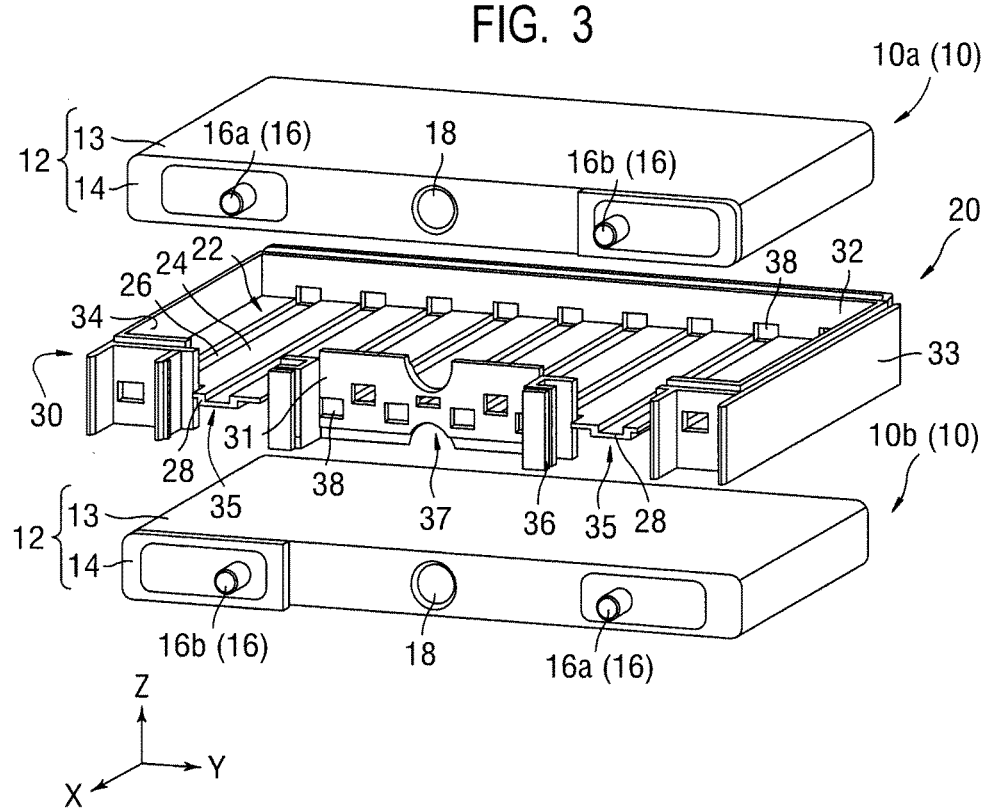
FIG. 3 is an exploded perspective view schematically illustrating part of an energy storage module according to one embodiment of the invention.
Figure 4:
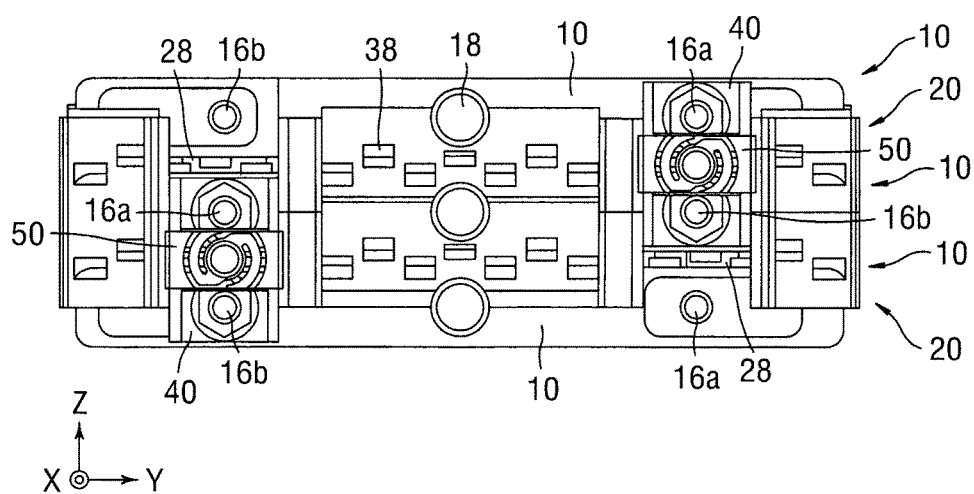
FIG. 4 is a view schematically illustrating part of an energy storage module according to one embodiment of the invention.
Figure 5:
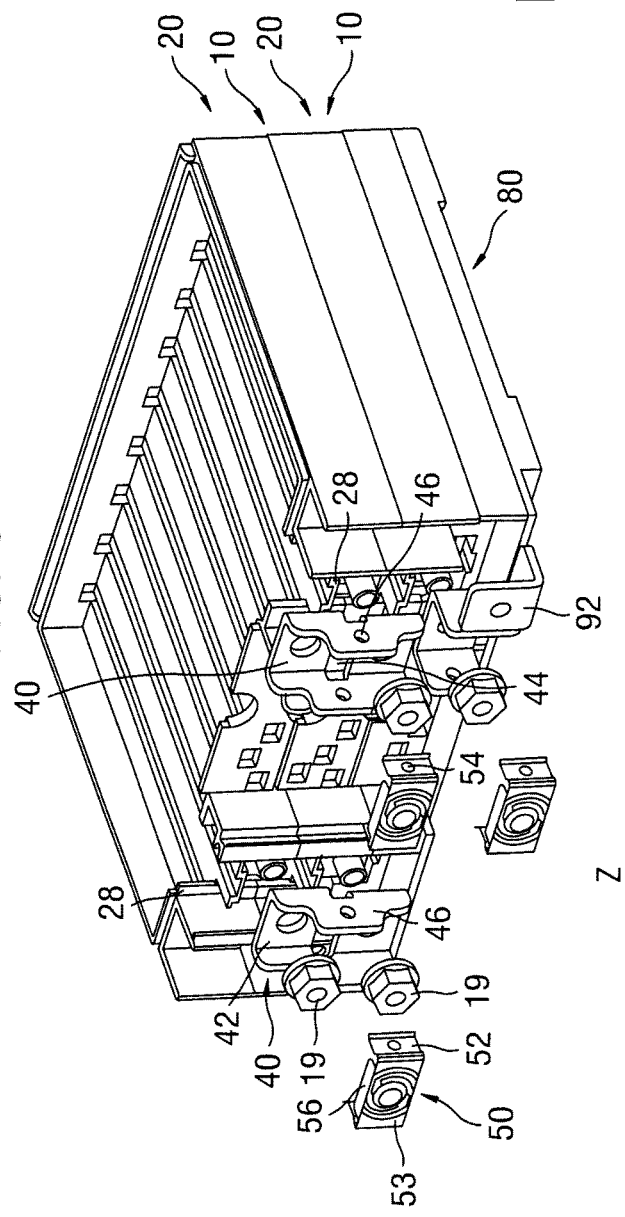
FIG. 5 is an exploded perspective view schematically illustrating part of an energy storage module according to one embodiment of the invention.

An energy storage module according to one embodiment of the invention is described below with reference to the drawings. FIG. 1 is a perspective view schematically illustrating an energy storage module 100 according to one embodiment of the invention. FIG. 2 is an exploded perspective view schematically illustrating the energy storage module 100 according to one embodiment of the invention. FIG. 3 is an exploded perspective view schematically illustrating part of the energy storage module 100 according to one embodiment of the invention. FIG. 4 is a view (taken along the arrow IV in FIG. 1) schematically illustrating part of the energy storage module 100 according to one embodiment of the invention. FIG. 5 is an exploded perspective view schematically illustrating part of the energy storage module 100 according to one embodiment of the invention.

As illustrated in FIGS. 1 to 5, the energy storage module 100 includes an energy storage cell 10, a bus bar 40, a conductive member 50, a wiring board 60, and a detection section 70. The energy storage module 100 may include a separator 20, detection section-receiving members 74 and 76, a base member 80, a cell securing member 81, and module terminals 90 and 92.

In FIG. 1, one wiring board 60 is omitted for convenience. FIG. 3 illustrates a configuration corresponding to two energy storage cells 10, FIG. 4 illustrates a configuration corresponding to three energy storage cells 10, and FIG. 5 illustrates a configuration corresponding to two energy storage cells 10 and the base member 80.

The energy storage module 100 may have a configuration in which a plurality of energy storage cells 10 are stacked (laminated) in the Z-axis direction through the separator 20. The number of energy storage cells 10 is not particularly limited, and may be appropriately changed depending on the application of the energy storage module 100. Examples of the energy storage cell 10 include a lithium-ion capacitor, a secondary battery, an electrical double-layer capacitor, and the like.

When the energy storage cell 10 is a lithium-ion capacitor, activated carbon, a polyacene-based material (PAS) (i.e., a material obtained by subjecting an aromatic fused polymer to a heat treatment), or the like may be used as a cathode active material, and graphite, non-graphitizable carbon (hard carbon), or the like may be used as an anode active material. The potential of the anode can be decreased by doping (pre-doping) the anode with lithium ions. The energy density can thus be increased.

As illustrated in FIG. 3, the energy storage cell 10 may include an outer package 12 and electrode terminals 16 (cathode terminal 16a and anode terminal 16b).

The outer package 12 receives a cathode, an anode, and an electrolyte solution (not illustrated in FIG. 3). The shape of the outer package 12 is not particularly limited as long as the outer package 12 can receive the cathode, the anode, the electrolyte solution. In the example illustrated in FIG. 3, the outer package 12 includes a case 13 and a sealing plate 14.

The case 13 may have a box-like shape in which the thickness (i.e., the dimension in the Z-axis direction) is smaller than the width (i.e., the dimension in the Y-axis direction) and the length (i.e., the dimension in the X-axis direction), and the four corners are chamfered. The planar shape (i.e., the shape viewed along the Z-axis direction) of the case 13 is a rectangle having long sides that extend along the Y-axis direction and short sides that extend along the X-axis direction, for example. Examples of a material for forming the case 13 include aluminum, stainless steel, iron, and the like. Note that the case 13 may have a cylindrical shape.

The sealing plate 14 seals the opening of the case 13. The cathode, the anode, and the electrolyte solution can thus be sealed inside the outer package 12. The shape of the sealing plate 14 is not particularly limited as long as the sealing plate 14 can seal the opening of the case 13. Examples of a material for forming the sealing plate 14 include aluminum, stainless steel, iron, and the like.

The cathode and the anode provided in the outer package 12 may be prepared by laminating a sheet-shaped cathode and a sheet-shaped anode through a separator to form a laminate sheet, and winding the laminate sheet, or laminating a plurality of sheet-shaped cathodes and a plurality of sheet-shaped anodes through a separator.

As illustrated in FIG. 3, the cathode terminal 16a is provided on the sealing plate 14. The shape of the cathode terminal 16a is not particularly limited. In the example illustrated in FIG. 3, the cathode terminal 16a has a bolt-like shape. Examples of a material for forming the cathode terminal 16a include aluminum and the like. The cathode terminal 16a is electrically connected to the cathode provided in the outer package 12.

The anode terminal 16b is also provided on the sealing plate 14. The shape of the anode terminal 16b is not particularly limited. In the example illustrated in FIG. 3, the anode terminal 16b has a bolt-like shape. Examples of a material for forming the anode terminal 16b include copper, nickel, and the like. The anode terminal 16b is electrically connected to the anode provided in the outer package 12.

The anode terminal 16b of the energy storage cell 10b that is adjacent to the energy storage cell 10a is situated in the Z-axis direction (i.e., the stacking direction of the energy storage cells 10) of the cathode terminal 16a of the energy storage cell 10a. Therefore, a plurality of energy storage cells 10 can be easily connected in series.

A safety valve 18 is provided to the sealing plate 14. The safety valve 18 is disposed between the cathode terminal 16a and the anode terminal 16b. In the example illustrated in FIG. 3, the safety valve 18 is disposed at the center of the sealing plate 14. The safety valve 18 is opened when the pressure inside the outer package 12 has increased to a value equal to or larger than a given value to discharge gas from the outer package 12. An increase in pressure inside the outer package 12 can be suppressed by opening the safety valve 18.

As illustrated in FIG. 3, the separator 20 is provided between the adjacent energy storage cells 10. The separator 20 is formed of a resin (e.g., plastic), for example. The separator 20 electrically and thermally insulates the adjacent energy storage cells 10.

The separator 20 may include a cell support section 22 that supports the energy storage cell 10, and a sidewall 30 that is provided around the cell support section 22. The planar shape of the cell support section 22 is a rectangle having long sides that extend along the Y-axis direction and short sides that extend along the X-axis direction, for example. The cell support section 22 has an uneven cross-sectional shape (shape in the YZ plane) having protrusions 24 and recesses 26.

The protrusions 24 come in contact with the outer package 12. The cell support section 22 supports the energy storage cell 10 utilizing the protrusions 24. The recesses 26 extend along the X-axis direction, for example. The recesses 26 are disposed at equal intervals in the Y-axis direction, for example.

The number of protrusions 24 and the number of recesses 26 are not particularly limited. The protrusions 24 and the recesses 26 have a relationship in which the protrusions 24 that come in contact with the energy storage cell 10a serve as the recesses 26 for the energy storage cell 10b that is adjacent to the energy storage cell 10a, and the protrusions 24 that come in contact with the energy storage cell 10b serve as the recesses 26 for the energy storage cell 10a.

The sidewall 30 is provided around the cell support section 22. The sidewall 30 extends in the Z-axis direction relative to the cell support section 22. The sidewall 30 may include a first sidewall 31, a second sidewall 32, a third sidewall 33, and a fourth sidewall 34.

The first sidewall 31 is provided along the long side direction (Y-axis direction) of the cell support section 22, for example. Openings 35 in which the terminals 16a and 16b are disposed are formed in the first sidewall 31. The terminals 16a and 16b protrude outward from the separator 20 through the openings 35.

In the example illustrated in FIG. 3, a protrusion section 28 is disposed in each opening 35. The protrusion section 28 protrudes from the rectangular cell support section 22 in the extension direction (+X direction) of the terminals 16a and 16b in a plan view. As illustrated in FIG. 3, the protrusion section 28 may be formed integrally with the cell support section 22. The protrusion section 28 is positioned between the terminal 16a or 16b of the energy storage cell 10a and the terminal 16a or 16b of the energy storage cell 10b that is adjacent to the energy storage cell 10a. This makes it possible to prevent a situation in which the terminal 16a or 16b of the energy storage cell 10a and the terminal 16a or 16b of the energy storage cell 10b are short-circuited when a nut or the like falls by mistake during assembly of the energy storage module, for example. Moreover, it is unnecessary to increase the distance between the adjacent energy storage cells 10 in order to ensure insulation (i.e., the distance between the adjacent energy storage cells 10 can be reduced). Therefore, the size of the energy storage module 100 can be reduced.

A slit 36 is formed in the first sidewall 31 along the stacking direction (Z-axis direction) of the energy storage cells 10, for example. The wiring board 60 is inserted into the slit 36. As illustrated in FIG. 2, the wiring board 60 is moved in the Z-axis direction along the slit 36 to secure the wiring board 60 (see FIG. 2).

As illustrated in FIG. 3, a depression 37 is formed in the first sidewall 31. The depression 37 is formed at a position corresponding to the safety valve 18 of the energy storage cell 10. When gas is discharged from the safety valve 18, the gas is discharged to the outside through the depression 37.

The second sidewall 32 is provided along the long side direction (Y-axis direction) of the cell support section 22, for example. The second sidewall 32 may be disposed opposite to the first sidewall 31. Through-holes 38 are formed in the first sidewall 31 and the second sidewall 32, for example. More specifically, the through-holes 38 are formed along an extension of each recess 26. The through-holes 38 are formed in the first sidewall 31 and the second sidewall 32 in the X-axis direction. The through-holes 38 formed in the first sidewall 31 and the through-holes 38 formed in the second sidewall 32 may be positioned opposite to each other. The shape and the number of through-holes 38 are not particularly limited. The through-holes 38 and the recesses 26 function as an air vent, and improve the heat dissipation capability of the energy storage cell 10.

The energy storage module 100 may include a cooling fan for supplying air to the air vent formed by the through-holes 38 and the recesses 26 (not illustrated in the drawings). A heat insulator may be disposed in each recess 26.

The third sidewall 33 and the fourth sidewall 34 are provided along the short side direction (X-axis direction) of the cell support section 22, for example. The third sidewall 33 and the fourth sidewall 34 are connected to the first sidewall 31 and the second sidewall 32. The third sidewall 33 and the fourth sidewall 34 may be disposed opposite to each other.

Figure 6:
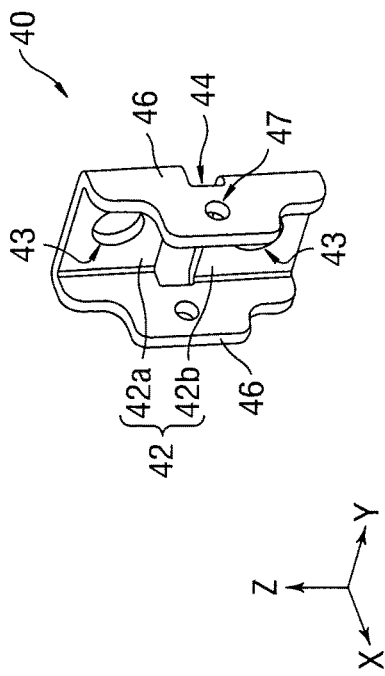
FIG. 6 is a perspective view schematically illustrating part of an energy storage module according to one embodiment of the invention.

FIG. 6 is a perspective view schematically illustrating the bus bar 40. The bus bar 40 electrically connects a plurality of terminals 16 a and 16 b. Specifically, the bus bar 40 connects a plurality of energy storage cells 10 in series.

More specifically, the bus bar 40 electrically connects the cathode terminal 16*a* of one energy storage cell 10 and the anode terminal 16*b* of the adjacent energy storage cell 10. This makes it possible to increase the output of the energy storage module 100. Note that the bus bar 40 may connect a plurality of energy storage cells 10 in parallel (not illustrated in the drawings).

Examples of a material for forming the bus bar 40 include a copper-based metal, an aluminum-based metal, and the like. It is preferable that the bus bar 40 be formed of a copper-based metal due to high conductivity. The contact resistance of the bus bar 40 can be reduced by plating the bus bar 40 with a metal such as nickel or gold. A nickel-based metal is also effective for preventing electrochemical corrosion. The bus bar 40 may be formed of iron, an alloy, or the like.

The shape of the bus bar 40 is not particularly limited as long as the bus bar 40 can electrically connect a plurality of terminals 16*a* and 16*b*. As illustrated in FIG. 6, the bus bar 40 may include a terminal connection section 42 that is connected to the terminals 16*a* and 16*b*, and a conductive member connection section 46 that is connected to the conductive member 50.

First through-holes 43 are formed in the terminal connection section 42. The first through-holes 43 are formed through the terminal connection section 42 in the X-axis direction. The first through-holes 43 are formed at positions corresponding to the terminals 16*a* and 16*b*. The bus bar 40 is secured by disposing the bus bar 40 so that the terminals 16*a* and 16*b* are inserted into the first through-holes 43, and screwing nuts 19 on the terminals 16*a* and 16*b* (see FIG. 5). The shape of the first through-holes 43 is not particularly limited as long as the terminals 16*a* and 16*b* can be inserted into the first through-holes 43. In the example illustrated in FIG. 3, the first through-holes 43 have a circular shape.

A metal washer may be provided between the bus bar 40 and the nut 19 (not illustrated in the drawings). This makes it possible to improve the heat dissipation capability of the energy storage cell 10.

As illustrated in FIG. 6, a second through-hole 44 is formed in the terminal connection section 42, for example. The second through-hole 44 is formed through the terminal connection section 42 in the X-axis direction. The second through-hole 44 is formed between the two first through-holes 43. As illustrated in FIG. 5, the protrusion section 28 of the separator 20 is disposed between the terminals 16*a* and 16*b* through the second through-hole 44. The shape of the second through-hole 44 is not particularly limited as long as the second through-hole 44 can receive the protrusion section 28. As illustrated in FIG. 6, the terminal connection section 42 includes a cathode terminal connection section 42*a* that is connected to the cathode terminal 16*a*, and an anode terminal connection section 42*b* that is connected to the anode terminal 16*b*, the cathode terminal connection section 42*a* and the anode terminal connection section 42*b* being defined by the second through-hole 44.

The conductive member connection section 46 is provided around the terminal connection section 42 so that the conductive member connection section 46 perpendicularly intersects the terminal connection section 42, for example. In the example illustrated in FIG. 6, two conductive member connection sections 46 are provided, and disposed opposite to each other. A third through-hole 47 is formed in the conductive member connection section 46, for example. The third through-hole 47 is formed through the conductive member connection section 46 in the Y-axis direction. The conductive member 50 is secured on the conductive member connection section 46 by disposing the bus bar 40 and the conductive member 50 so that the third through-hole 47 coincides with a through-hole 54 (see FIGS. 5 and 7) of the conductive member 50, and inserting a pin or the like (not illustrated in the drawings) into the through-holes 47 and 54. Note that the conductive member 50 may be secured on the conductive member connection section 46 by providing a protrusion that protrudes toward the bus bar 40 instead of the through-hole 54, and fitting the protrusion into the third through-hole 47 (not illustrated in the drawings). For example, when the conductive member 50 has spring properties, the conductive member 50 can be more reliably secured on the conductive member connection section 46.

Figure 7:
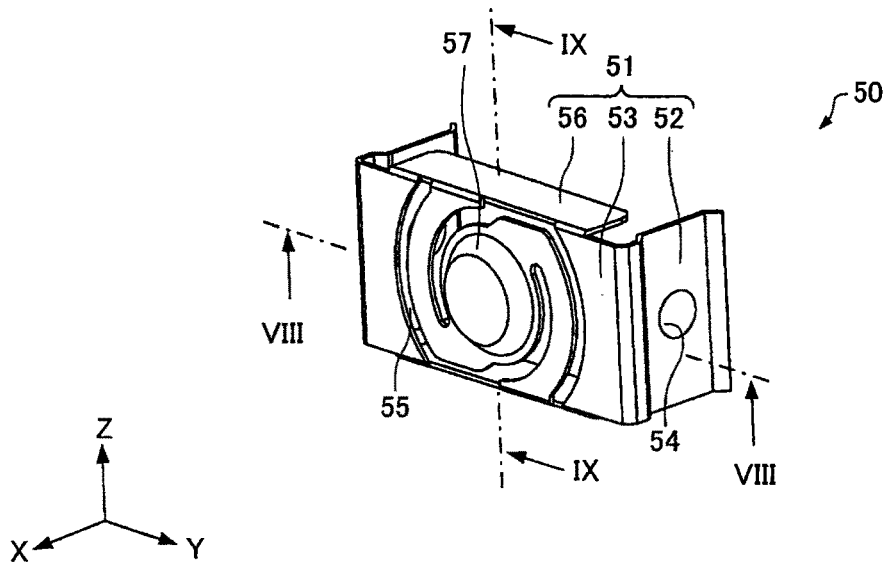
FIG. 7 is a perspective view schematically illustrating part of an energy storage module according to one embodiment of the invention.
Figure 8A:
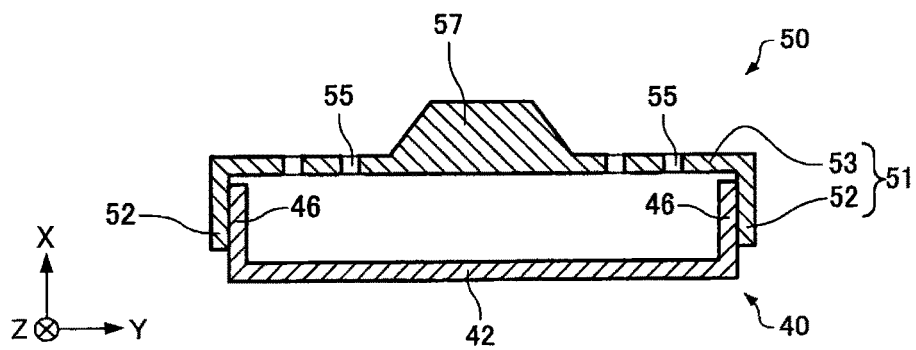
FIG. 8A is a cross-sectional view schematically illustrating part of an energy storage module according to one embodiment of the invention.
Figure 8B:
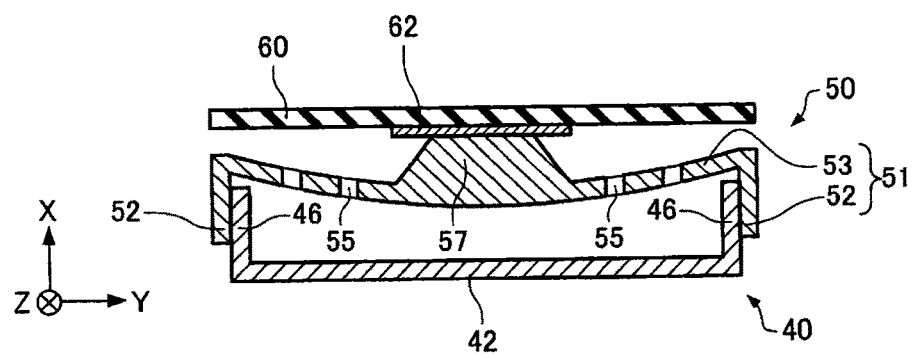
FIG. 8B is a cross-sectional view schematically illustrating part of an energy storage module according to one embodiment of the invention.
Figure 9A:
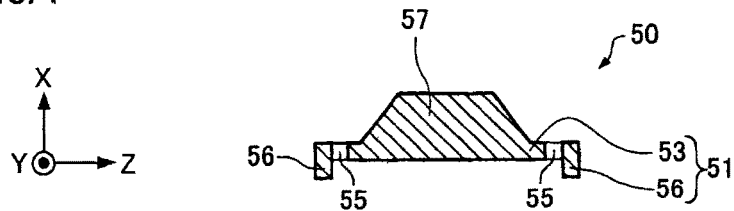
FIG. 9A is a cross-sectional view schematically illustrating part of an energy storage module according to one embodiment of the invention.
Figure 9B:
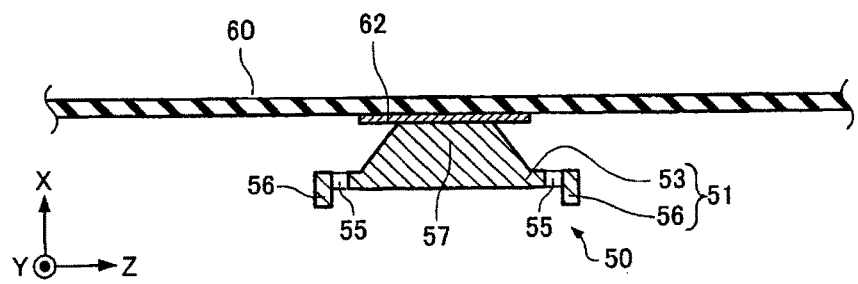
FIG. 9B is a cross-sectional view schematically illustrating part of an energy storage module according to one embodiment of the invention.

FIG. 7 is a perspective view schematically illustrating the conductive member 50. FIGS. 8A and 8B are cross-sectional views taken along the line VIII-VIII in FIG. 7 (e.g., cross-sectional views in the XY plane) that schematically illustrate the conductive member 50. FIGS. 9A and 9B are cross-sectional views taken along the line IX-IX in FIG. 7 (e.g., cross-sectional views in the XZ plane) that schematically illustrate the conductive member 50.

Note that FIGS. 8A and 9A illustrate a state in which the conductive member 50 does not come in contact with a pad 62, and FIGS. 8B and 9B illustrate a state in which the conductive member 50 comes in contact with the pad 62. In FIGS. 8A, 8B, 9A, and 9B, the conductive member 50 is schematically illustrated for convenience. In FIGS. 8A and 8B, the bus bar 40 is schematically illustrated for convenience.

The conductive member 50 is secured on the conductive member connection section 46 of the bus bar 40. The conductive member 50 has conductivity. Examples of a material for forming the conductive member 50 include a copper-based metal, an aluminum-based metal, and the like. It is preferable that the conductive member 50 be formed of a copper-based metal due to high conductivity. The contact resistance of the conductive member 50 can be reduced by plating the conductive member 50 with a metal such as nickel or gold. A nickel-based metal is also effective for preventing electrochemical corrosion. As illustrated in FIGS. 7, 8A, 8B, 9A, and 9B, the conductive member 50 may include a first section 51 and a second section 57.

The first section 51 may include a securing target section 52, a support section 53, and a joint 56. The securing target section 52 is connected to the periphery of the support section 53. The securing target section 52 may be disposed opposite to the conductive member connection section 46 of the bus bar 40. A through-hole 54 for securing the securing target section 52 on the bus bar 40 is formed in the securing target section 52. The securing target section 52 can be secured on the bus bar 40, and the first section 51 can thus be connected to the bus bar 40.

A slit 55 is formed in the support section 53, for example. The resilience of the conductive member 50 can be adjusted by adjusting the shape of the slit 55. The support section 53 supports the second section 57.

The joint 56 is connected to the periphery of the support section 53. The external shape of the support section 53 can be maintained by the joint 56 even when the slit 55 is formed.

The second section 57 is supported by the first section 51. The second section 57 comes in contact with the pad 62 (see FIG. 12) formed on the wiring board 60. As illustrated in FIGS. 9A and 9B, the second section 57 may have a tapered shape so that the width (i.e., the dimension in the Z-axis direction) of the second section 57 increases as the distance from the first section 51 decreases. In this case, the wiring board 60 can be moved smoothly when moving the wiring board 60 in the Z-axis direction along the slit 36 of the separator 20 (see FIG. 2) after stacking a plurality of energy storage cells 10. For example, when using a conductive member that does not have a tapered shape, the wiring board may be caught by the conductive member, and may not be moved smoothly. As illustrated in FIGS. 8A and 8B, the second section 57 may have a tapered shape so that the dimension in the Z-axis direction and the dimension in the Y-axis direction of the second section 57 increase as the distance from the first section 51 decreases.

As illustrated in FIGS. 8B and 9B, the support section 53 may be curved due to a force in the −X-direction when the second section 57 has come in contact with the pad 62. In this case, the support section 53 may bias the second section 57 toward the pad 62 (in the +X-direction). Specifically, the conductive member 50 may be a resilient member. This makes it possible to increase the contact pressure between the conductive member 50 and the pad 62, and suppress a change in contact resistance between the conductive member 50 and the pad 62. It is also possible to ensure reliable electrical connection between the conductive member 50 and the pad 62. Note that a through-hole may be formed in advance in the wiring board 60, the pad 62, and the conductive member 50 after electrically connecting the conductive member 50 and the pad 62, and the wiring board 60, the pad 62, and the conductive member 50 may be secured using a screw or the like at a position at which the through-holes coincide with each other.

Figure 10:
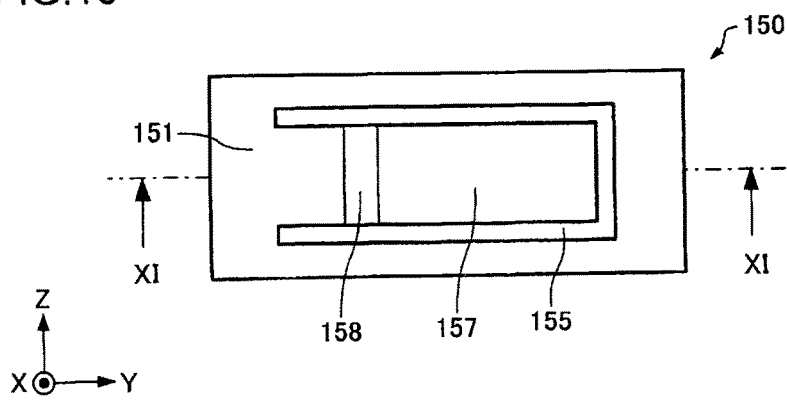
FIG. 10 is a view schematically illustrating part of an energy storage module according to one embodiment of the invention.
Figure 11:
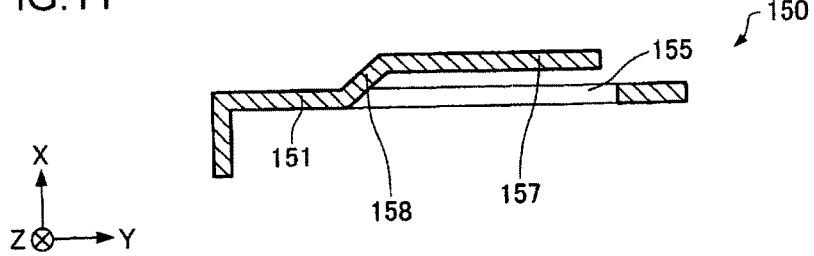
FIG. 11 is a cross-sectional view schematically illustrating part of an energy storage module according to one embodiment of the invention.

The shape of the conductive member 50 is not particularly limited as long as the conductive member 50 can bias the second section 57 (i.e., a part that comes in contact with the pad 62) toward the pad 62. As illustrated in FIGS. 10 and 11, a conductive member 150 according to a modification may include a first section 151 that is connected to the bus bar 40, a second section 157 that is spaced from the first section 151 through a slit 155, and a third section 158 that connects the first section 151 and the second section 157. The second section 157 is disposed closer to the pad 62 as compared with the first section 151, and comes in contact with the pad 62. The second section 157 may have one or more slits that extend in the Y-axis direction (not illustrated in the drawings). This makes it possible to provide the conductive member 50 (resilient member) with higher flexibility, and smoothly move the wiring board 60. FIG. 10 is a view schematically illustrating the conductive member 150 according to the modification. FIG. 11 is a cross-sectional view taken along the line XI-XI in FIG. 10 that schematically illustrates the conductive member 150 according to the modification.

The conductive member 50 is not limited to a resilient member as long as the conductive member 50 can electrically connect the bus bar 40 and the pad 62. For example, the conductive member 50 may be a conductive seal.

As illustrated in FIGS. 1 and 2, the wiring board 60 may have a plate-like shape. The wiring board 60 extends in the stacking direction (Z-axis direction) of a plurality of energy storage cells 10. Two wiring boards 60 may be provided to cover the terminals 16a and 16b, the bus bar 40, and the conductive member 50. This makes it possible to suppress a situation in which the terminals 16a and 16b and the like come in contact with an external member (not illustrated in the drawings), and are short-circuited, for example.

Figure 12:
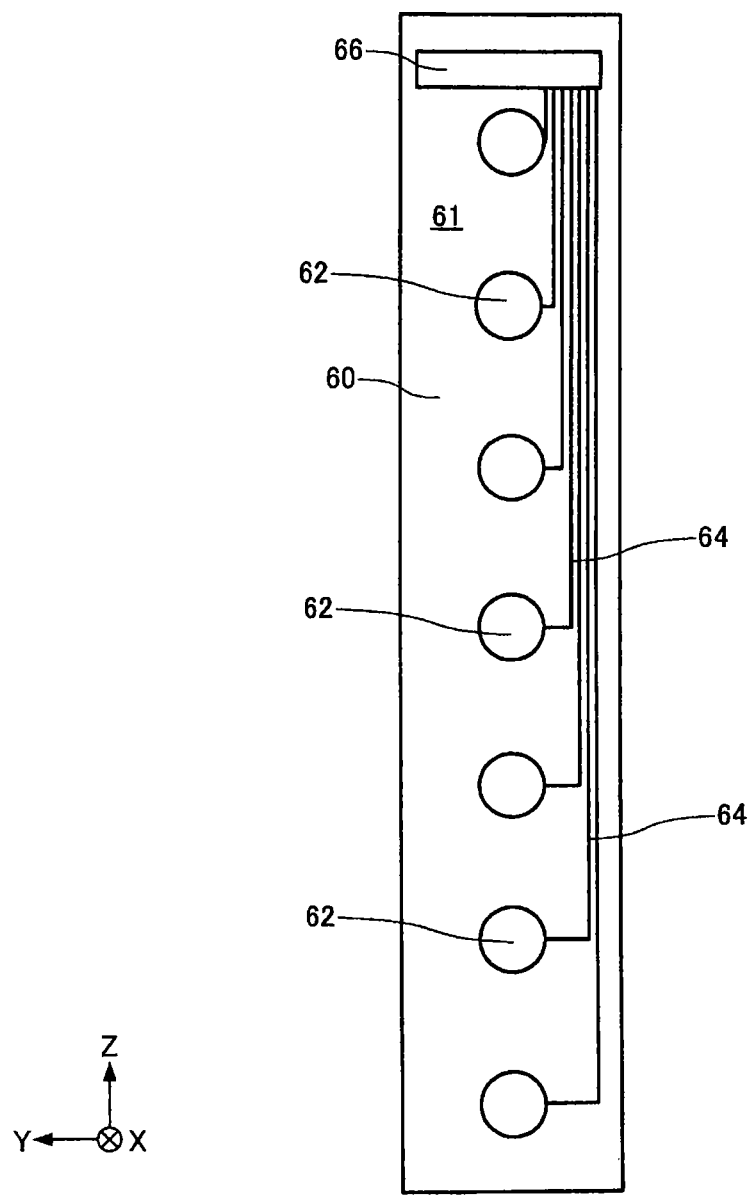
FIG. 12 is a view schematically illustrating part of an energy storage module according to one embodiment of the invention.

FIG. 12 is a view schematically illustrating an opposing side 61 of the wiring board 60 that is opposite to the conductive member 50. As illustrated in FIG. 12, the pads 62 and wires 64 are formed on the opposing side 61 of the wiring board 60.

A plurality of pads 62 are formed in the number of conductive members 50. The plurality of pads 62 are electrically separated from each other. The plurality of pads 62 are arranged in the Z-axis direction at the same intervals as the intervals between the conductive members 50. The shape of the pads 62 is not particularly limited. In the example illustrated in FIG. 12, the pads 62 have a circular shape. The pads 62 have conductivity. Examples of a material for forming the pads 62 include aluminum, stainless steel, copper, a metal provided with nickel plating or gold plating, and the like. The pad 62 comes in contact with the conductive member 50.

The wire 64 is connected to the pad 62. A plurality of wires 64 are formed in the number of pads 62. The plurality of wires 64 are electrically separated from each other. The wires 64 have conductivity. Examples of a material for forming the wires 64 include copper and the like. The plurality of wires 64 are electrically connected to the detection section 70 illustrated in FIG. 2 through a connector 66 formed on the wiring board 60, for example. The terminals 16a and 16b of the energy storage cell 10 and the detection section 70 can thus be electrically connected.

The wires 64 may be formed inside the wiring board 60 instead of forming the wires 64 on the opposing side 61 (not illustrated in the drawings). In FIG. 12, the connector 66 is schematically illustrated for convenience.

As illustrated in FIG. 2, the detection section 70 is formed on a circuit board 71, for example. The detection section 70 is formed by an IC, for example. As illustrated in FIG. 2, a connector connection section 72 that is connected to the connector 66 is formed on the circuit board 71, and the detection section 70 is electrically connected to the connector connection section 72, for example. The detection section 70 detects the output voltage of each energy storage cell 10. A control section that determines whether or not the output voltage of each energy storage cell 10 detected by the detection section 70 is normal, and restores the output voltage when it has been determined that the output voltage is abnormal may be provided on the circuit board 71.

The first detection section-receiving member 74 supports the circuit board 71 on which the detection section 70 is formed. The first detection section-receiving member 74 is provided over the stacked energy storage cells 10. The first detection section-receiving member 74 may have a box-like shape. The circuit board 71 can be positioned inside the space formed by the first and second detection section-receiving members 74 and 76 by covering the opening of the first detection section-receiving member 74 with the second detection section-receiving member 76. The second detection section-receiving member 76 is secured by inserting a screw 78 into each through-hole 77, and securing the second detection section-receiving member 76 on the first detection section-receiving member 74, for example. The first and second detection section-receiving members 74 and 76 are formed of a resin (e.g., plastic), for example.

The base member 80 is provided under the stacked energy storage cells 10. The base member 80 supports the stacked energy storage cells 10. The base member 80 is formed of a resin (e.g., plastic), for example.

Figure 13:
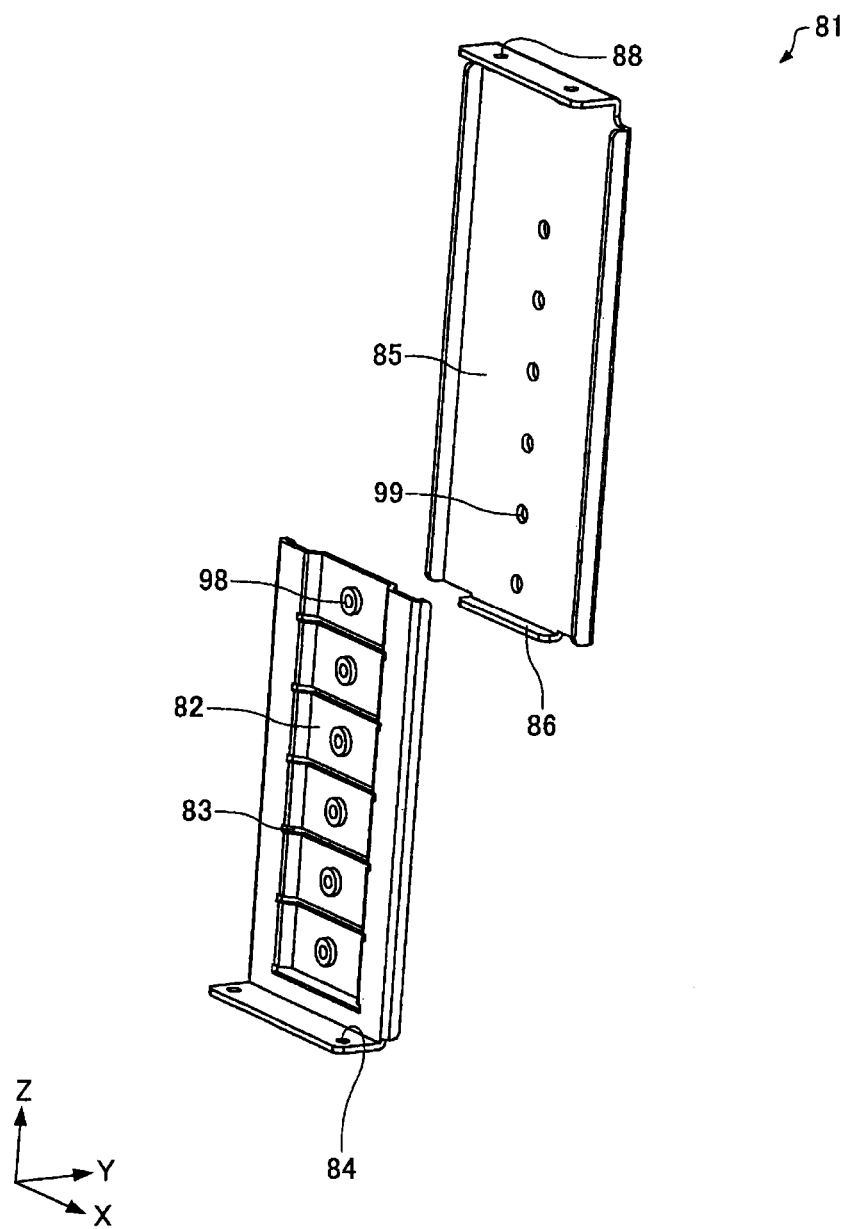
FIG. 13 is an exploded perspective view schematically illustrating part of an energy storage module according to one embodiment of the invention.

The cell securing member 81 is provided on the side of the stacked energy storage cells 10. More specifically, the cell securing members 81 are provided on the sidewalls 33 and 34 of the separator 20. Examples of a material for forming the cell securing member 81 include, but are not limited to, metals such as aluminum, stainless steel, and iron, heat-resistant resins, and the like. FIG. 13 is an exploded perspective view schematically illustrating the cell securing member 81 at an angle differing from that of FIGS. 1 and 2.

As illustrated in FIG. 13, the cell securing member 81 may include a first securing member 82 and a second securing member 85. A plurality of slits 83 are formed in the first securing member 82 at equal intervals in the Z-axis direction, for example. The interval between adjacent slits 83 may be the same as the thickness (i.e., the dimension in the Z-axis direction) of one energy storage cell 10. The second securing member 85 may include a protrusion section 86 that protrudes toward the first securing member 82. The protrusion section 86 can be inserted into one of the plurality of slits 83. The dimension of the cell securing member 81 in the Z-axis direction can be changed by inserting the protrusion section 86 into the desired slit 83. Specifically, the dimension of the cell securing member 81 in the Z-axis direction can be changed corresponding to the number of stacked energy storage cells 10.

A through-hole 84 is formed in the first securing member 82. The first securing member 82 can be secured on the base member 80 by inserting a screw or the like (not illustrated in the drawings) into the through-hole 84. A through-hole 88 is formed in the second securing member 85. The second securing member 85 can be secured on the first detection section-receiving member 74 by inserting a screw 89 (see FIG. 2) into the through-hole 88.

As illustrated in FIG. 13, a through-hole 98 is formed in the first securing member 82, and a through-hole 99 is formed in the second securing member 85. The first securing member 82 and the second securing member 85 can be secured by inserting a screw or the like (not illustrated in the drawings) into the through-holes 98 and 99.

As illustrated in FIG. 1, the cathode module terminal 90 is electrically connected to the cathode terminal 16a of the uppermost energy storage cell 10 among the stacked energy storage cells 10. Examples of a material for forming the cathode module terminal 90 include copper, aluminum, a metal (e.g., copper or aluminum) provided with nickel plating or gold plating, and the like. The cathode module terminal 90 serves as a cathode of the energy storage module 100.

The anode module terminal 92 is electrically connected to the anode terminal 16b of the lowermost energy storage cell 10 among the stacked energy storage cells 10. Examples of a material for forming the anode module terminal 92 include copper, aluminum, a metal provided with nickel plating or gold plating, and the like. The anode module terminal 92 serves as an anode of the energy storage module 100.

Although FIG. 1 illustrates an example in which the cathode module terminal 90 is disposed at a position higher than the anode module terminal 92, the cathode module terminal 90 may be disposed at a position lower than the anode module terminal 92.

The energy storage module 100 according to the embodiments of the invention may be applied to on-vehicle applications (e.g., hybrid car, electric vehicle, and automatic guided vehicle (AGV)), stationary applications (e.g., X-ray examination, domestic power supply, and wind power generator), and the like.

The energy storage module 100 according to the embodiments of the invention has the following features, for example.

The energy storage module 100 is configured so that the conductive member 50 secured on the bus bar 40 comes in contact with the pad 62 formed on the wiring board 60, and the pad 62 is electrically connected to the detection section 70 through the wire 64 formed on the wiring board 60. The detection section 70 can thus be electrically connected to the electrode terminals 16 (16a and 16b) of the energy storage cell 10. Specifically, the electrode terminals 16 and the detection section 70 can easily be electrically connected without using a wire harness. More specifically, a plurality of electrode terminals 16 can be simultaneously brought into contact with the pads 62 by moving the wiring board 60 in the stacking direction (Z-axis direction) of the energy storage cells 10 along the slits 36.

A wire harness has a problem in that the wire may break, or an insulating section that covers the wire may be removed, for example. Since the energy storage module 100 does not utilize a wire harness, the energy storage module 100 can prevent occurrence of such a problem, and exhibits high reliability.

A wire harness also has a problem in that it is necessary to provide a sufficient installation space. Since the energy storage module 100 does not utilize a wire harness, the size of the energy storage module 100 can be reduced. Therefore, the energy density of the energy storage module 100, can be improved.

The energy storage module 100 is configured so that the conductive member 50 may be a resilient member. This makes it possible to increase the contact pressure between the conductive member 50 and the pad 62, and suppress a change in contact resistance between the conductive member 50 and the pad 62. It is also possible to ensure reliable electrical connection between the conductive member 50 and the pad 62. For example, the detection section 70 is required to detect the output voltage of the energy storage cell 10 up to about several mV. However, the contact resistance may change when the contact pressure between the conductive member and the pad is low, and it may be difficult to reliably detect the output voltage.

The energy storage module 100 is configured so that the conductive member 50 includes the first section 51 that is connected to the bus bar 40, and the second section 57 that comes in contact with the pad 62, and the second section 57 may have a tapered shape so that the width (i.e., the dimension in the Z-axis direction) of the second section 57 increases as the distance from the first section 51 decreases. Therefore, the wiring board 60 can be moved smoothly when moving the wiring board 60 in the Z-axis direction along the slit 36 of the separator 20 after stacking a plurality of energy storage cells 10. For example, when using a conductive member that does not have a tapered shape, the wiring board may be caught by the conductive member, and may not be moved smoothly.

The invention is not limited to the above embodiments. Various modifications and variations may be made of the above embodiments. For example, a plurality of embodiments and/or a plurality of modifications described above may be appropriately combined. The invention includes various other configurations substantially the same as the configurations described in connection with the embodiments (e.g., a configuration having the same function, method, and results, or a configuration having the same objective and results). The invention also includes a configuration in which an unsubstantial section (element) described in connection with the above embodiments is replaced with another section (element). The invention also includes a configuration having the same effects as those of the configurations described in connection with the above embodiments, or a configuration capable of achieving the same objective as that of the configurations described in connection with the above embodiments. The invention further includes a configuration in which a known technique is added to the configurations described in connection with the above embodiments.

REFERENCE SIGNS LIST

10: energy storage cell, 12: outer package, 13: case, 14: sealing plate, 16: electrode terminal, 16 a: cathode terminal, 16 b: anode terminal, 18: safety valve, 19: nut, 20: separator, 22: cell support section, 24: protrusion, 26: recess, 28: protrusion section, 30: sidewall, 31: first sidewall, 32: second sidewall, 33: third sidewall, 34: fourth sidewall, 35: opening, 36: slit, 37: depression, 38: through-hole, 40: bus bar, 42: terminal connection section, 42 a: cathode terminal connection section, 42 b: anode terminal connection section, 43: first through-hole, 44: second through-hole, 46: conductive member connection section, 47: third through-hole, 50: conductive member, 51: first section, 52: securing target section, 53: support section, 54: through-hole, 55: slit, 56: joint, 57: second section, 60: wiring board, 61: opposing side, 62: pad, 64: wire, 66: connector, 70: detection section, 71: circuit board, 72: connector connection section, 74: first detection section-receiving member, 76: second detection section-receiving member, 77: through-hole, 78: screw, 80: base member, 81: cell securing member, 82: first securing member, 83: slit, 84: through-hole, 85: second securing member, 86: protrusion section, 88: through-hole, 89: screw, 90: cathode module terminal, 92: anode module terminal, 98: through-hole, 99: through-hole, 100: energy storage module, 150: conductive member, 151: first section, 155: slit, 157: second section, 158: third section.

The invention claimed is:

1. An energy storage module in which a plurality of energy storage cells including electrode terminals are stacked, the energy storage module comprising:
   a bus bar that electrically connects a plurality of electrode terminals among the electrode terminals;
   a conductive member that is secured on the bus bar;
   a detection section that detects a voltage of each of the plurality of energy storage cells;
   a wiring board on which a wire and a pad are formed, the wire being electrically connected to the detection section, and the pad being connected to the wire; and
   a separator that is provided between adjacent energy storage cells among the plurality of energy storage cells,
   the conductive member including a first section that is connected to the bus bar and a second section that is supported by the first section,
   wherein the second section comes in contact with the pad,
   wherein the first section is configured to bias the second section toward the pad, and
   wherein a slit is formed in the separator, and the wiring board is secured on the slit.

2. The energy storage module according to claim 1, wherein the conductive member has spring properties.

3. The energy storage module according to claim 1, wherein the second section includes a tapered shape so that a width of the second section increases as a distance from the first section decreases.

4. The energy storage module according to claim 1, wherein the bus bar connects the plurality of electrode terminals in series.

5. The energy storage module according to claim 1, wherein the wiring board extends in a stacking direction of the plurality of energy storage cells.

6. The energy storage module according to claim 1, wherein each of the plurality of energy storage cells is a lithium-ion capacitor.

7. The energy storage module according to claim 1, further comprising:
   a separator that is provided between adjacent energy storage cells among the plurality of energy storage cells.

8. The energy storage module according to claim 1, wherein the first section is configured to bias the second section toward the pad when the second section comes in contact with the pad.

9. The energy storage module according to claim 8, wherein the first section is configured to bias the second section in an X-axis direction.

10. A method of manufacturing an energy storage module in which a plurality of energy storage cells including electrode terminals are stacked, the energy storage module including a bus bar that electrically connects a plurality of electrode terminals among the electrode terminals, a conductive member that is secured on the bus bar, a detection section that detects a voltage of each of the plurality of energy storage cells, a wiring board on which a wire and a pad are formed, the wire being electrically connected to the detection section, and the pad being connected to the wire, and a separator that is provided between adjacent energy storage cells among the plurality of energy storage cells, the conductive member including a first section that is connected to the bus bar and a second section that is supported by the first section, the second section coming in contact with the pad, the first section being configured to bias the second section toward the pad, and a slit being formed in the separator, and the wiring board being secured on the slit, the method comprising:
   causing the conductive member to come in contact with the pad by moving the wiring board in a stacking direction of the plurality of energy storage cells along the slit formed in the separator.

* * * * *